(12) United States Patent
Krutko et al.

(10) Patent No.: US 7,015,519 B2
(45) Date of Patent: Mar. 21, 2006

(54) STRUCTURES AND METHODS FOR FABRICATING VERTICALLY INTEGRATED HBT/FET DEVICE

(75) Inventors: Oleh Krutko, Glen Gardner, NJ (US); Kezhou Xie, Edison, NJ (US); Mohsen Shokrani, Greenbrook, NJ (US); Aditya Gupta, Bridgewater, NJ (US); Boris Gedzberg, Coram, NY (US)

(73) Assignee: Anadigics, Inc., Warren, NJ (US)

( * ) Notice: Subject to any disclaimer, the term of this patent is extended or adjusted under 35 U.S.C. 154(b) by 37 days.

(21) Appl. No.: 10/783,830

(22) Filed: Feb. 20, 2004

(65) Prior Publication Data

US 2005/0184310 A1   Aug. 25, 2005

(51) Int. Cl.
  *H01L 31/072* (2006.01)
(52) U.S. Cl. .................. 257/197; 257/192; 257/195; 257/273; 257/279; 257/284; 257/E27.012; 257/E27.015
(58) Field of Classification Search ...................... None
  See application file for complete search history.

(56) References Cited

U.S. PATENT DOCUMENTS

| | | | | |
|---|---|---|---|---|
| 4,821,090 A | * | 4/1989 | Yokoyama | 257/195 |
| 5,012,318 A | * | 4/1991 | Honjo | 257/195 |
| 5,243,207 A | * | 9/1993 | Plumton et al. | 257/192 |
| 5,250,826 A | * | 10/1993 | Chang et al. | 257/273 |
| 6,906,359 B1 | * | 6/2005 | Zampardi et al. | 257/197 |

OTHER PUBLICATIONS

W.J. Ho, M.F. Chang, S.M. Beccue, P.J. Zampardi, J. Yu, A. Sailer, R.L. Pierson, K.C. Wang, "A GaAs BiFET LSI technology", GaAs IC Sym. Tech. Dig., 1994, p. 47.

D. Cheskis, C. E. Chang, W. H. Ku, P. M. Asbeck, M.F. Chang, R.L. Pierson, S. Sailer,"Co-integration of GaAlAs/GaAs HBT's and GaAs FET's with a simple manufacturable process", IEDM Tech. Dig., 1992, p. 91.

D. C. Streit, D. K. Umemoto, K. W. Kobayashi, A. K. Oki, "Monolithik HEMT-HBT integration by selective MBE". IEEE Trans. Electron Devices, vol. 42, 1995, p. 618.

D. C. Streit, D. K. Umemoto, J. R. Velebir, K. W. Kobayashi, A. K. Oki, "35 GHz HEMT amplifiers fabricated using integration HEMT-HBT material grown by selective MBE", IEEE Microwave Guided Wave Lett., vol. 4, 1994, p. 361.

K. Itakura, Y. Shimamoto, T. Ueda, S. Katsu, D. Ueda, "A GaAs Bi-FET technology for large scale integration", IEDM Tech. Dig., 1989, p. 389.

Y. F. Yang, C.C. Hsu, E.S. Yang, "Integration of GaInP/GaAs heterojunction bipolar transistors and high electron mobility transitors", IEEE Electron Device Lett., vol. 17, No. 7, Jul. 1996, p. 363.

J. H. Tsai, "Integrated fabrication of InGaP/GaAs d-doped heterojunction bipolar transistor and doped-channel field effect transistor", 2002 IEEE, p. 365.

J. Jang, E. C. Kan, T. Arnborg, T. Johansson, R. Dutton, "Characterization of RF Power BJT and Improvement of Thermal Stability with Nonlinear Base Ballasting", 1998 IEE, p. 1428.

* cited by examiner

*Primary Examiner*—Andy Huynh

(57) ABSTRACT

Methods and systems for fabricating integrated pairs of HBT/FET's are disclosed. One preferred embodiment comprises a method of fabricating an integrated pair of GaAs-based HBT and FET. The method comprises the steps of: growing a first set of epitaxial layers for fabricating the FET on a semi-insulating GaAs substrate; fabricating a highly doped thick GaAs layer serving as the cap layer for the FET and the subcollector layer for the HBT; and producing a second set of epitaxial layers for fabricating the HBT.

13 Claims, 7 Drawing Sheets

| Layer | Material | Doping Type | Doping Concentration | Thickness 1 nm =10 Å | Al or In % |
|---|---|---|---|---|---|
| 108 | InGaAs | Te doped N+ | >1.0E19 cm$^{-3}$ | 400Å | 60 |
| | InGaAs | Te doped N+ | >1.0E19 cm$^{-3}$ | 400Å | linear grade 0-60 |
| | GaAs | Si doped N+ | >4.0E18 cm$^{-3}$ | 1200Å | 0 |
| 107 | InGaP | Si doped N+ | 3.0E17 cm$^{-3}$ | 500Å | lattice matched |
| 106 | GaAs | C doped P+ | 4.0E19 cm$^{-3}$ | 1100Å | 0 |
| 105 | GaAs | Si doped N | 1.5E16 cm$^{-3}$ | 7000Å | 0 |
| | GaAs | Si doped N | 4.0E16 cm$^{-3}$ | 3000Å | 0 |
| | GaAs | Si doped N+ | >4.0E18 cm$^{-3}$ | 500Å | 0 |
| 124 | InGaP | Si doped N+ | >1.0E18 cm$^{-3}$ | 200Å | lattice matched |
| 104 | GaAs | Si doped N+ | >4.0E18 cm$^{-3}$ | 3500Å | 0 |
| 103 | InGaP | Si doped N+ | >1.0E18 cm$^{-3}$ | 200Å | lattice matched |
| 122 | GaAs | Si doped N | 3.2E17 cm$^{-3}$ | 1200Å | 0 |
| | GaAs | Undoped | N/A | 500Å | 0 |
| 121 | AlGaAs | Undoped | N/A | 2500Å | 24 |
| | GaAs | Undoped | N/A | 750Å | 0 |

Fig. 3

| Parameter | HBT |
|---|---|
| DC gain | 85 |
| $f_T$, GHz | 30 @ 25kA/cm$^2$ |
| $f_{max}$, GHz | 45 @ 25kA/cm$^2$ |
| Vknee, V | 0.5 |
| Voffset, V | 0.1 |
| Bvceo, V | 15 |
| Bvcbo, V | 29.5 |
| Bvbeo, V | 8 |

Fig. 6

| Parameter | FET |
|---|---|
| Vp, Volts | -1.5 |
| Ron, Ohm mm | 3.5 |
| Idss, mA/mm | 180 |
| BVGD, Volts | 14 |
| Ileak, uA/mm | 2 |

Fig. 7

STRUCTURES AND METHODS FOR FABRICATING VERTICALLY INTEGRATED HBT/FET DEVICE

FIELD OF INVENTION

This invention is related in general to HBT/FET fabrication technologies and in particular to structures and methods for fabricating integrated InGaP/GaAs HBT/FET's on the same chip at a competitive cost.

BACKGROUND OF INVENTION

InGaP/GaAs HBT Technology is very attractive for use in many commercial applications for its excellent reliability and thermal stability. The first generation of InGaP-based power amplifiers for wireless handsets, wireless LAN, broadband gain blocks, and high-speed fiber optic products have been successfully developed and marketed. For future generations of these products, it is important to reduce the die size and cost as well as to provide additional functionality with improved circuit performance. The integration of bipolar (HBT) and field effect transistors (FET or HEMT) on the same chip offers a unique way to achieve these goals. While the combination of bipolar and field effect devices in an integrated circuit is well known in the silicon world (BiCMOS), there has been no viable way to realize this concept in GaAs-based technologies for large volume commercial applications.

Several methods of integrating AlGaAs/GaAs HBT with field effect devices have been discussed in the literature. In one approach described in Ho et al., "A GaAs BiFET LSI technology", GaAs 1C Sym. Tech. Dig., 1994, p. 47, and D. Cheskis et al., "Co-integration of GaAlAs/GaAs HBT's and GaAs FET's with a simple manufacturable process", IEDM Tech. Dig., 1992, p. 91, the HBT emitter cap layer is used as a FET channel. This approach had two major drawbacks. First, the emitter resistance of the HBT is high and second, the parasitic effect of the base layer degrades FET performance and limits its applications.

Another approach is to grow HBT and HEMT structures by selective MBE growth. (See Streit, et al., "Monolithik HEMT-HBT integration by selective MBE", IEEE Trans. Electron Devices, vol. 42, 1995, p. 618 and Streit, et al., "35 GHz HEMT amplifiers fabricated using integration HEMT-HBT material grown by selective MBE", IEEE Microwave Guided Wave Lett., vol. 4, 1994, p. 361.) The problem with this approach is the requirement of epi-growth interruption, wafer processing and epi re-growth. These steps render this approach un-manufaurable (i.e. high cost) with poor epi quality control.

It has also been shown that AlGaAs/GaAs HBT may be grown on top of the HEMT in a single growth run. (See K, Itakura. Y. Shimamolo, T. Ueda, S. Katsu, D. Ueda, "A GaAs Bi-FET technology for large scale integration", IEDM Tech. Dig., 1989, p. 389.) In this approach the FET is merged into the collector of the HBT through a single epitaxial growth.

Several attempts have been also made to integrate InGaP/GaAs HBT with MESFET and HEMT. (See J. H. Tsai, "Characteristics of InGaP/GaAs co-integrated d-doped heterojunction bipolar transistor and doped-channel field effect transistor," Solid State Electronics, vol. 46., 2002, p. 45 and Yang et al., "Integration of GaInP/GaAs heterojunction bipolar transistors and high electron mobility transistors", IEEE Electron Device Lett., vol. 17, no, 7, July 1996, p. 363. In these approaches the channel of the field effect devices used an InGaP layer with low mobility and saturation velocity which results in high linear resistance and poor high frequency performance. These devices also show threshold voltages lower than −2 Volts. These characteristics, however, make them largely unsuitable for commercial applications.

There is therefore a need for methods and epitaxial structures for fabricating integrated pairs of GaAs-based HBT and FET devices that are suitable for commercial applications.

SUMMARY OF INVENTION

One aspect of the present invention is a structure comprising a first epitaxial layer on top of the substrate; a second layer structure on top of the first epitaxial layer, and a third epitaxial layer on top of the second epitaxial layer. In one embodiment, the first epitaxial layer forms a portion of a field effect transistor. The third epitaxial layer forms a portion of a bipolar transistor. The second epitaxial layer is shared by the bipolar and the field effect transistors.

Another aspect of the present invention comprises a method of fabricating integrated bipolar transistor and field effect transistors on the same substrate. In one embodiment, the method comprises the steps of: providing the three-layer structure comprising a first, second, and third epitaxial layer; fabricating the bipolar transistor from the first epitaxial layer of the structure; isolating the second and third epitaxial layers of the structure; and optimizing the field effect transistor and the bipolar transistor independently.

Yet another aspect of the present invention comprises an integrated pair of bipolar and field effect transistors. In one embodiment, the bipolar and field effect transistors share a contact layer. The contact layer serves as both the cap layer for the field effect transistor and the subcollector layer for the bipolar transistor.

Yet another aspect of the present invention comprises a method of fabricating an epitaxial structure for fabricating an integrated pair of GaAs-based HBT and FET. In one embodiment, the method comprises the steps of: growing a first set of epitaxial layers for fabricating the FET on a semi-insulating GaAs substrate; fabricating a highly doped thick GaAs layer serving as the cap layer for the FET and the subcollector layer for the HBT; and producing a second set of epitaxial layers for fabricating the HBT.

BRIEF DESCRIPTION OF DRAWINGS

FIG. 3 describes the characteristics of each layer in the epitaxial structure in one embodiment of this invention.

FIGS. 6–7 summarize the characteristics of the HBT and MESFET fabricated according to one embodiment of this invention.

DETAILED DESCRIPTION OF PREFERRED EMBODIMENTS

Figure 1:
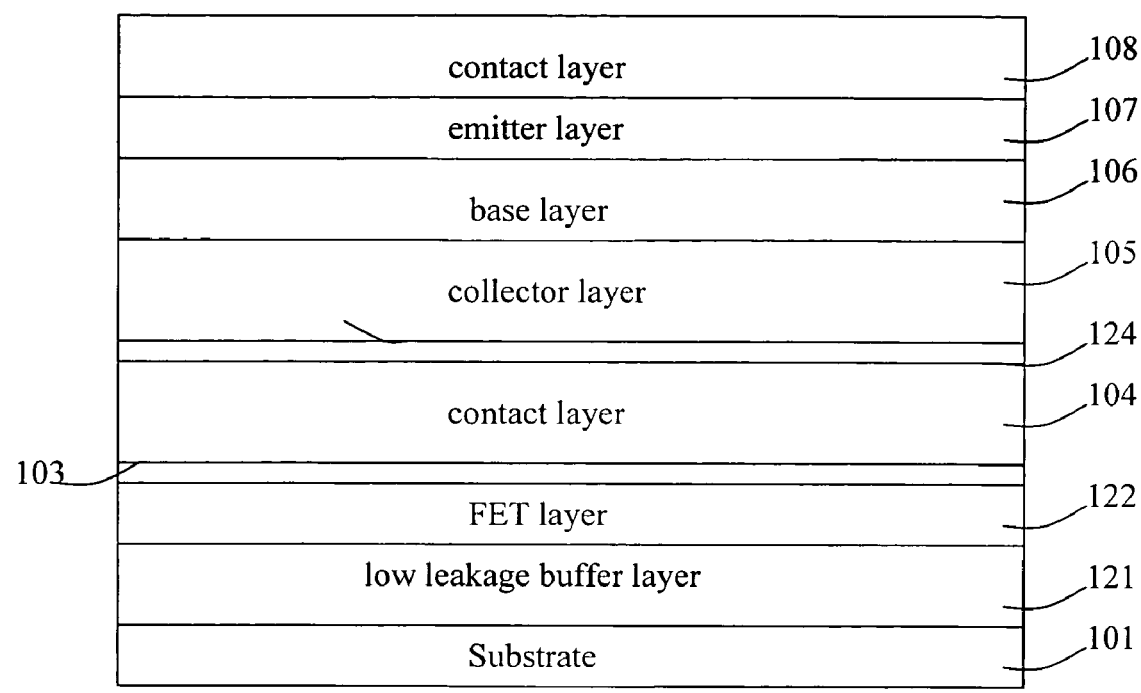
FIG. 1 illustrates a structure for fabricating an integrated FET and HBT pair in one embodiment of this invention.

FIG. 1 illustrates the formation of the structure for fabricating an integrated FET and HBT pair in one embodiment of this invention. Substrate 101 is first provided and may be a semi-insulating GaAs wafer substrate, or any suitable substrate for fabricating the integrated HBT and FET pair. The GaAs substrate 101 may be fabricated using well-known crystal-growth technologies such as the Czochralski technique or the Bridgman technique. Detailed descriptions of these techniques can be found, for example, at page 343–349 of S. M. Sze, "Semiconductor Devices: Physics and Technology", 2nd Ed., John Wiley & Sons, Inc. 2002.

After providing the substrate 101, a first epitaxial structure 102 may be grown on top of the substrate 101. The epitaxial structure 102 may comprise one or more epitaxial layers. The epitaxial structure 102 (and other epitaxial structures grown on top of it) may be fabricated using well-known technologies such as chemical vapor deposition (CVD), Metalorganic CVD (MOCVD), or molecular bean epitaxy (MBE). Detailed descriptions of these technologies can be found, for example, at page 356–361 of S. M. Sze, "Semiconductor Devices: Physics and Technology", 2nd Ed., John Wiley & Sons, Inc. 2002.

The composition and thickness of each epitaxial layer in the epitaxial structure 102 may depend on the application and the type of FET that is being fabricated. In FIG. 1, the epitaxial structure 102 comprises a first set of epitaxial layers 121 and a second set of epitaxial layers 122. The first set of epitaxial layers 121 may be used to form a low leakage buffer layer, which can help reduce the substrate leak current and output conductance, thereby improving the efficiency of the FET. The low leakage buffer layer may (but not necessarily) further comprise one or more undoped GaAs or AlGaAs layers. The thickness of each layer and the aluminum mole fraction of each AlGaAs layer may be chosen to optimize the performance of the FET or the HBT. The low leakage buffer layer may comprise an undoped GaAs layer approximately 75 nm (1 nm=$10^{-9}$ meter) thick and an undoped AlGaAs layer with approximately 250 nm thick. The undoped AlGaAs may comprise approximately 25% Al.

The second set of epitaxial layers 122 may be used to form the epitaxial structure for the FET. The layer structure and the thickness of each epitaxial layer in the epitaxial layers 122 may depend on the application and the type of FET that is being fabricated. In FIG. 1, the epitaxial layers 122 form the epitaxial structure for a MESFET. The set of epitaxial layers 122 may comprise an approximately 50 nm thick undoped GaAs spacer layer and a doped GaAs channel layer of about 120 nm thick. The spacer layer can help carrier confinement and provide spatial separation between the active channel and the AlGaAs/GaAs heterojunction in the buffer layer 121. The doping type and concentration of the channel layer depends on the application. For example, the channel layer may be doped with n-type Silicon with a doping concentration of approximately $3.2 \times 10^{17}$ $cm^{-3}$. Moreover, a thin (about 20 nm) highly doped InGap etch stop layer 103 may be grown on top of the GaAs channel layer for recess etch reproducibility. As known by skilled people in the field, other layered structures may be fabricated for other types of MESFET and are intended to be encompassed by this invention.

In other embodiments, the epitaxial layers 122 form the epitaxial structure for a pHEMT. The set of epitaxial layers 122 may further comprise a lower GaAs barrier layer, an InGaAs channel layer and an AlGaAs Schottky barrier layer. Double delta doping may be used between these layers to further improve the performance. A thin (about 20 nm) highly doped InGap etch stop layer may be grown on top of the AlGaAs Schottky layer for recess etch reproducibility. Depending on the application, the pHEMT epitaxial structure may be formed by different layer structure and doping methods known to skilled people in the field.

After completion of the growth of the first epitaxial structure 102, a second epitaxial structure is then grown on top of the first epitaxial structure 102. In FIG. 1, the second epitaxial layer further comprises a highly doped GaAs contact layer 104 that is grown on top of the etch-stop layer 103. The contact layer 104 may be shared by the FET and the HBT. The contact layer 104 serves as the cap layer for the FET and the subcollector layer for the HBT. The requirements for the contact layer may include low resistivity for both the FET and the HBT. The doping concentration in this layer can be the maximum doping concentration achievable from the growth technology. In an illustrative example, an n-type Silicon doping with a doping concentration of greater then $4.0 \times 10^{18}$ $cm^{-3}$ is used for the contact layer 104.

Figure 2A:
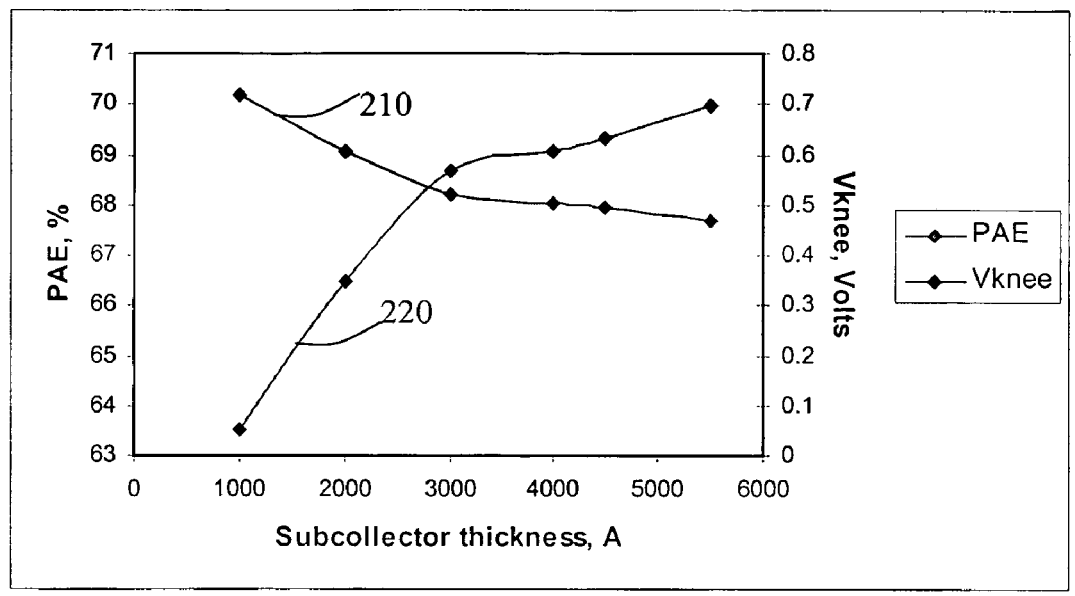
FIGS. 2a–2b demonstrate the results of a sensitivity study of the relationships between subcollector thickness and the power-added efficiency (PAE), cut-off frequency (ft) and maximum oscillating frequency (fmax) characteristics of the HBT.
Figure 2B:
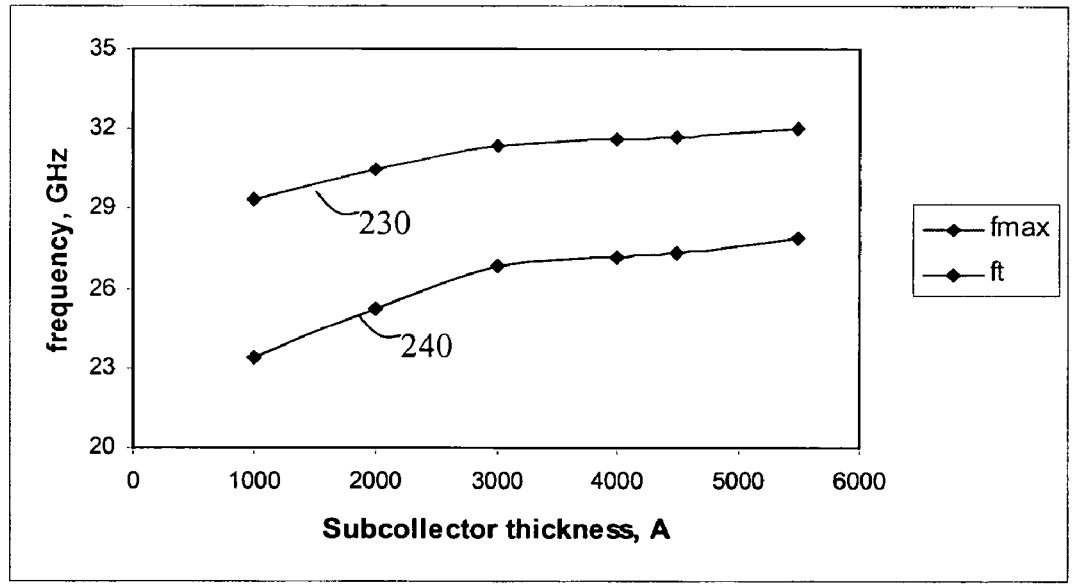

The thickness of the contact layer 104 depends on the application. The thickness of the contact layer may be chosen based on the following trade-off. The thickness of the subcollector layer may be increased so that the HBT does not have excessive collector resistance and degraded performance. On the other hand, a thinner cap may be preferred to minimize surface topology and simplify the FET fabrication process. More specifically, in the embodiment shown in FIG. 1, the thickness of the contact layer 104 is selected based on a sensitivity study of the relationships between HBT characteristics and subcollector thickness. Such a study may be performed using, for example, a physical device simulator, such as the ATLAS device simulation software provided by SILVACO International, headquartered in Santa Clara, Calif. FIGS. 2a–2b illustrate the results of a sensitivity study of the relationships between subcollector thickness and the power-added efficiency (PAE), cut-off frequency (ft) and maximum oscillating frequency (fmax) characteristics of the HBT. Specifically, curve 220 in FIG. 2a shows the relationship between subcollector thickness and the power-added efficiency (PAE). Curve 230 of FIG. 2b shows the relationship between subcollector thickness and the cut-off frequency (ft). Curve 240 of FIG. 2b shows the relationship between subcollector thickness and the maximum oscillating frequency (fmax). A thickness of 350 nm may be selected for the contact layer 104, based in part on the result of this study.

The rest of the HBT layers may be fabricated on top of the contact layer 104 using existing HBT fabrication Technologies. In the embodiment shown in FIG. 1, for example, an n-type GaAs collector layer 105 of thickness from about 800 nm to about 1200 nm is grown on top of the contact layer 104. A p-type GaAs base layer 106 and an n-type InGaP emitter 107 layer are then grown on the collector layer 105 followed by a highly doped InGaAs contact layer 108. The HBT structure described above is a generic form. The thickness and doping characteristics of the HBT structure may be optimized further for specific applications. For example, the collector layer 105 may comprise two lightly doped GaAs layers. The base layer 106 may be about 110 nm thick and doped with carbon at a concentration of about $4.0 \times 10^{19}$ $cm^{-3}$. The emitter layer 107 may be about 50 nm thick and doped with silicon with a doping concentration of about $3.0 \times 10^{17}$ $cm^{-3}$. The contact layer 108 may be about 40 nm thick and doped with Tellurium (Te) with a doping concentration of $1.0\times10^{19}$ cm$^{-3}$. A thin (about 20 nm) InGaP etch stop layer 124 may be grown between the contact layer 104 and the collector layer 105. The epitaxial layers 102–108 described above can be fabricated in a single MOCVD or MBE growth run. FIG. 3 summaries the characteristics of each layer in the epitaxial structure in the embodiment shown in FIG. 1.

Figure 4:
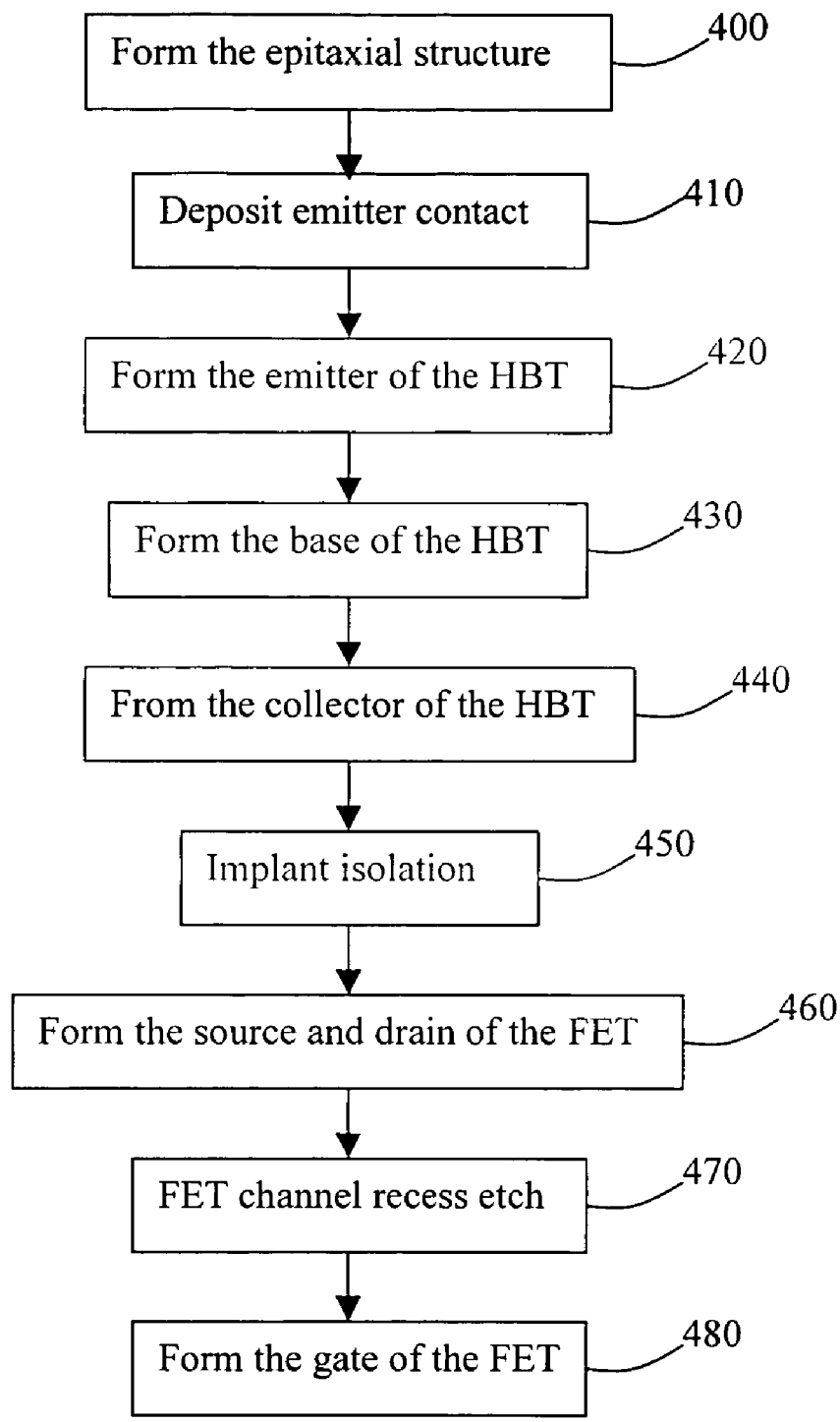
FIG. 4 shows the process flow used in the fabrication of HBT/FETs according to one embodiment of this invention.
Figure 5:
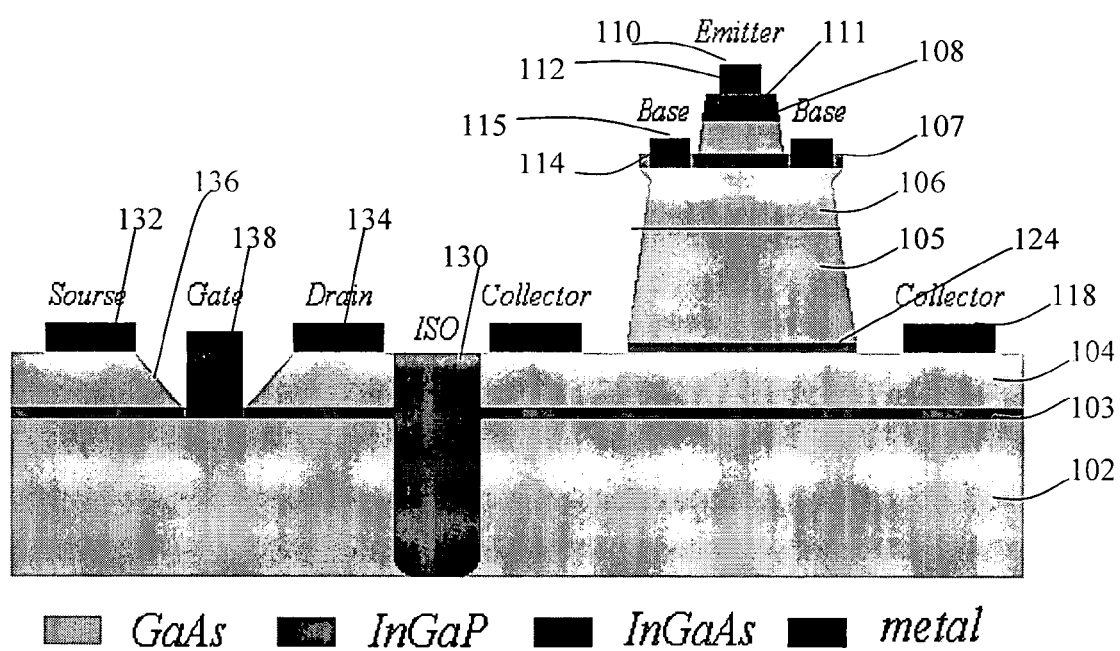
FIG. 5 shows a cross-section view of the integrated pair of HBT and FET formed during the process of FIG. 4.

The fabricated epitaxial structure may then be processed to fabricate the integrated HBT and FET pair. FIG. 4 shows the process flow used in the fabrication of HBT/FETs according to one embodiment of this invention. FIG. 5 illustrates a cross-section view of the integrated pair of HBT and FET formed during the process shown in FIG. 4. Epitaxial layers 102–108 are first grown on a wafer substrate 101 in step 400. In step 410, the emitter contact 110 is deposited on the wafer after establishing alignment keys on the wafer. In this step, the emitter area 111 is first defined using photoresist. Next, the emitter metal film 112 is deposited over the photoresist. The emitter film 112 may be formed by metals such as Ti, Pt, Pl, Au, Al, or Cu or metal compounds or alloys formed using these metals. The emitter film 112 may be deposited using well-known physical-vapor deposition (PVD) methods such as e-beam evaporation, plasma spray deposition, or sputtering. In the embodiment shown in FIG. 4, a Ti/Pt/Au or Pt/Ti/Pt/Au emitter film 112 is deposited on the photoresist by e-beam evaporation. Those portions of emitter film on the photoresist but not on the emitter area are then removed using the well-known liftoff technique.

In step 420, the emitter of the HBT is formed by etching the emitter layer 107 and the contact layer 108. In the embodiment shown in FIG. 4, the emitter layer 107 and the contact layer 108 are placed in a phosphoric acid-based chemistry that is selective to InGaP to etch the emitter after depositing the emitter contact.

In step 430, the base of the HBT is formed. In this step, the base area 114 is first defined using photoresist. Base contact 115 is then deposited on the photoresist using similar PVD and liftoff technologies as described above. In FIG. 4, an InGaP etch through the photoresist openings may be performed prior to base metal evaporation to define the InGaP ledge and expose the base layer 106 for base contact deposition. The InGaP layer 107 may be etched in a hydrochloric acid based chemistry which is selective to GaAs. After depositing the base contact 115, the base layer 106 is then etched to produce the base of the HBT. In the embodiment shown in FIG. 4, the base layer 106 is etched in a phosphoric acid-based chemistry that is selective to GaAs.

In step 440, the collector of the FET is formed. In this step, the collector area 117 is first formed using photoresist. Collect contacts 118 are then deposited on the photoresist using similar PVD and liftoff technologies as described above. In FIG. 4, the collector layer 105 is first etched in a phosphoric acid based chemistry for the GaAs layer 105 and then etched in a hydrochloric acid based chemistry for the InGaP layer 124.

In step 450, an isolation barrier 130 is implanted after the collector etch to isolate the HBT and the FET so that the HBT and the FET can be optimized independently. The subcollector layer is exposed except underneath the HBT base area. A passivation layer may be deposited on the wafer using well-known chemical vapor deposition (CVD) methods to protect the HBT device during subsequent process steps. A nitride passivation layer is deposited on the wafer using plasma-enhanced CVD (PECVD). Besides isolating the HBT and the FET, the isolation barrier 130 may also be used to isolate the HBT/FET pair from other devices such as diodes or resistors that are fabricated on the same substrate. The isolation barrier 130 may be implanted using well-known ion or trench implantation techniques. In FIG. 4, the isolation barrier 130 may be formed using a He$^+$ ion implantation, wherein the isolation pattern is defined using a thick photoresist mask.

In step 460, the source contact 132 and the drain contact 134 of the FET are deposited on the wafer using well-known metal evaporation and liftoff technologies. The contacts 132 and 134 are made from AuGeNi and these contacts are deposited by evaporation of AuGeNi and the corresponding liftoff technique. In an alternative embodiment, the Collector contacts 118 are deposited in this step instead of in step 440.

In step 470, channel recess etch for the FET is performed. In this step, the FET recesses area 136 is first defined and the cap layer 104 is then etched. The cap layer 104 is etched in a phosphoric acid based chemistry for GaAs and the InGaP layer 103 is then etched in a Hydrochloric acid based chemistry for InGaP. The InGap etch stop layer 103 ensures a uniform and reproducible etch.

In step 480, the FET gate 138 is formed. The FET gate formation process may depend on the specific device structure and application requirements. For example, for driver or amplifier applications, a low resistance gate may be required and for such applications a T-gate process block may be introduced at this step. For applications such as dc/rf switch, an evaporated gate may be sufficient. The fabrication of T-gates and evaporated gates are well-known in the art. In the embodiment shown in FIG. 4, an evaporation gate is fabricated as follows. First, the FET gate is defined by a photoresist mask. The photoresist mask may be optimized for thickness to provide adequate coverage over the topology and for the minimum required gate length. Next, gate metal of TiPtAu is deposited by e-beam evaporation and lift-off technique. After completion of the FET gate 138, a nitride film may be deposited to passivate the FET.

The integrated HBT/FET pair fabricated may be further processed for passive component and interconnect fabrication. These steps can be performed using conventional IC fabrication techniques.

Devices fabricated using the integrated HBT/FET Technology described above show performance equivalent to similar non-integrated "stand-alone" HBT or FET transistors. This makes it possible to use them in commercial applications with no penalty in performance but with significant improvement in integration opportunities. The characteristics of the HBT and FET fabricated based on the epitaxial structure shown in FIG. 3 are summarized in FIG. 6 and FIG. 7. Since bipolar and field effect transistors are de-coupled by the isolation 130, the epitaxial layers that form these devices can be optimized independently to achieve any given device characteristics.

The method of integrating bipolar and field effect transistors described in this invention is not limited to GaAs-based devices alone. It can be used equally effectively on any set of bipolar and field effect transistors that can be fabricated using epitaxial active layers on the same substrate. Examples of bipolar and field effect transistor pairs may include, but not limited to, InP-based HBT and InP FET/pHEMT, GaN based HBT and GaN pHEMT/FET. Moreover, the integrated HBT and FET devices may be fabricated with alternative process flows, etch chemistries and ohmic contact metalizations. As an illustrative example, citric acid and sulfuric acid based chemistries may be used to selectively etch or dry etch GaAs/AlGaAs layers on InGaP layers. In another illustrative example, the FET recess and gate layers may be formed right after the formation of the HBT base.

The field effect transistor can be optimized for particular applications and can be either enhancement mode (E-mode) or depletion mode (D-mode) or it can be designed to provide both E and D mode FETs. E/D FETs are especially desirable for the implementation of digital logic functions. The Field Effect Transistor can be realized with alternative epitaxial layer structures known in the industry. Examples of alternative epitaxial layers include but not limited to pHEMT with InGaP as the Schottky layer, pHEMT with AlAs etch stop layer, double recessed pHEMT and MESFET, HIGFET and Hi/Lo MESFET.

Based on the above description, it may occur to any person skilled in the art that passive components such as N-resistor, NiCr resistor, MIM capacitor, spiral inductors, backside via and global and local interconnects may also be fabricated using processes similar to the processes described above.

While the above invention has been described with reference to certain preferred embodiments, the scope of the present invention is not limited to these embodiments. One skilled in the art may find variations of these embodiments which, nevertheless, fall within the spirit of the present invention, whose scope is defined by the claims set forth below.

We claim:

1. A structure comprising:
   a first epitaxial structure on top of the substrate, the epitaxial structure forming a portion of a FET;
   a second epitaxial structure on top of the first epitaxial structure, the second epitaxial structure being shared by a HBT and the FET; and
   a third epitaxial structure on top of the second epitaxial structure, the epitaxial structure forming a portion of the HBT.

2. The structure of claim 1, wherein the second epitaxial structure further comprises a contact layer, said contact layer serving as both a cap layer for the FET and a subcollector layer for the HBT.

3. The structure of claim 2, wherein the contact layer is highly doped.

4. The structure of claim 3, wherein the contact layer is a n-type GaAs layer having a doping concentration of approximately $4.0 \times 1018$ $cm^{-3}$ or more.

5. The structure of claim 2, wherein a thickness of the contact layer is determined based on one or more design trade-offs between the HBT and the FET.

6. The structure of claim 2, wherein a thickness of the contact layer is about 350 nm.

7. The structure of claim 1, wherein the first epitaxial structure further comprises a low leakage buffer layer.

8. The structure of claim 7, wherein the low leakage buffer layer further comprises one or more undoped GaAs or AlGaAs layers.

9. The structure of claim 1, wherein the first epitaxial structure further comprises a set of MESFET epitaxial layers.

10. The structure of claim 9, wherein the set of MESFET epitaxial layers further comprises an undoped GaAs spacer layer and a doped GaAs channel layer.

11. The structure of claim 1, wherein the first epitaxial structure further comprises a set of pHEMT epitaxial layers.

12. The structure of claim 11, wherein the set of pHEMT epitaxial layers further comprises a lower GaAs barrier layer, an InGaAs channel layer and an AlGaAs or InGaP Schottky barrier layer.

13. The structure of claim 1, wherein the third epitaxial structure further comprises a GaAs collector layer, a GaAs base layer and a InGaP emitter layer.

* * * * *

UNITED STATES PATENT AND TRADEMARK OFFICE
CERTIFICATE OF CORRECTION

PATENT NO. : 7,015,519 B2  
DATED : March 21, 2006  
INVENTOR(S) : Krutko et al.

Page 1 of 1

It is certified that error appears in the above-identified patent and that said Letters Patent is hereby corrected as shown below:

<u>Column 8,</u>
Line 9, replace "4.0x1018 cm$^{-3}$" with -- 4.0x10$^{18}$ cm$^{-3}$ --.

Signed and Sealed this

Thirtieth Day of May, 2006

JON W. DUDAS  
*Director of the United States Patent and Trademark Office*